(12) United States Patent
Chou et al.

(10) Patent No.: US 10,795,767 B2
(45) Date of Patent: Oct. 6, 2020

(54) ERROR CORRECTING SYSTEM SHARED BY MULTIPLE MEMORY DEVICES

(71) Applicant: M31 TECHNOLOGY CORPORATION, Hsinchu County (TW)

(72) Inventors: Zhi-Xian Chou, Pingtung County (TW); Wei-Chiang Shih, Hsinchu County (TW)

(73) Assignee: M31 TECHNOLOGY CORPORATION, Hsinchu County (TW)

(*) Notice: Subject to any disclaimer, the term of this patent is extended or adjusted under 35 U.S.C. 154(b) by 96 days.

(21) Appl. No.: 16/233,034

(22) Filed: Dec. 26, 2018

(65) Prior Publication Data

US 2020/0210289 A1   Jul. 2, 2020

(51) Int. Cl.
*G06F 11/10* (2006.01)
*G06F 11/00* (2006.01)
*G11C 11/419* (2006.01)

(52) U.S. Cl.
CPC ........ *G06F 11/1076* (2013.01); *G11C 11/419* (2013.01)

(58) Field of Classification Search
None
See application file for complete search history.

(56) References Cited

U.S. PATENT DOCUMENTS

| | | | |
|---|---|---|---|
| 5,590,287 A * | 12/1996 | Zeller | G06F 13/4018 710/307 |
| 6,683,817 B2 | 1/2004 | Wei et al. | |
| 7,227,797 B2 * | 6/2007 | Thayer | G06F 11/1044 365/200 |
| 7,673,216 B2 | 3/2010 | Hino et al. | |
| 7,779,333 B2 | 8/2010 | Taito et al. | |
| 7,996,734 B2 | 8/2011 | Earle et al. | |

(Continued)

FOREIGN PATENT DOCUMENTS

JP   2000163315 A   6/2000

OTHER PUBLICATIONS

English Abstract Translation of Foreign Patent Document No. JP2000163315A.

(Continued)

*Primary Examiner* — Justin R Knapp

(74) *Attorney, Agent, or Firm* — WPAT, P.C., Intellectual Property Attorneys; Anthony King

(57) ABSTRACT

An error correcting system is provided. The error correcting system includes an error correcting code (ECC) circuit and a control circuit. The ECC circuit is configured to encode input data received from M input terminals to generate encoded data in response to a write operation, and output the encoded data. The input data includes write data associated with the write operation, and the encoded data includes the input data and associated parity data. The control circuit is coupled to at least one of the M input terminals. When the write operation is directed to a memory device having a data bit width less than M bits, the write data is inputted to a portion of the M input terminals, the control circuit is configured to provide reference data to another portion of the M input terminals, and the write data and the reference data serve as the input data.

20 Claims, 9 Drawing Sheets

(56) References Cited

U.S. PATENT DOCUMENTS

| | | | |
|---|---|---|---|
| 8,321,757 B2* | 11/2012 | Meir | G06F 11/1068 |
| | | | 714/763 |
| 9,646,718 B2* | 5/2017 | Park | G11C 29/42 |
| 9,697,884 B2* | 7/2017 | Ware | G11C 11/4096 |
| 9,761,325 B1 | 9/2017 | Shi et al. | |
| 9,891,988 B2 | 2/2018 | Blaettler et al. | |
| 9,990,163 B2 | 6/2018 | Cha et al. | |
| 2013/0286752 A1* | 10/2013 | Michioka | G06F 11/1048 |
| | | | 365/189.05 |
| 2017/0315866 A1 | 11/2017 | Goldman et al. | |
| 2018/0039573 A1 | 2/2018 | Shung | |
| 2019/0138389 A1* | 5/2019 | Kawanishi | H03M 13/6502 |

OTHER PUBLICATIONS

Taiwan office action dated Feb. 3, 2020 for corresponding application 108124776.

* cited by examiner $$H1 = \begin{bmatrix} 1 & 0 & 1 & 0 & 1 & 0 & 1 & 0 & 1 & 1 & 1 & 1 \\ 0 & 1 & 0 & 1 & 0 & 1 & 0 & 1 & 0 & 1 & 1 & 1 \\ 0 & 0 & 1 & 1 & 0 & 0 & 1 & 1 & 0 & 1 & 1 & 1 \\ 0 & 0 & 0 & 0 & 1 & 1 & 1 & 1 & 0 & 1 & 1 & 1 \\ 0 & 0 & 0 & 0 & 0 & 0 & 0 & 0 & 1 & 1 & 1 & 1 \end{bmatrix}$$

FIG. 6

| Terminal | $Dm_1$ | $Dm_2$ | $Dm_3$ | $Dm_4$ | $Dm_5$ | $Dm_6$ | $Dm_7$ | $Dm_8$ | $Dm_9$ | $Dm_{10}$ | $Dm_{11}$ | $Dm_{12}$ |
|---|---|---|---|---|---|---|---|---|---|---|---|---|
| Type | Parity | Parity | Data | Parity | Data | Data | Data | Parity | Data | Data | Data | Data |
| Memory device $302_1$ | Activated | Activated | Activated | Activated | Activated | Activated | Activated | Activated | Activated | Activated | Activated | Activated |
| Memory device $302_2$ | Actived | Actived | Actived | Actived | Actived | Actived | Actived | Tied low | Tied low | Tied low | Tied low | Tied low |

| Terminal | $QM_1$ | $QM_2$ | $QM_3$ | $QM_4$ | $QM_5$ | $QM_6$ | $QM_7$ | $QM_8$ | $QM_9$ | $QM_{10}$ | $QM_{11}$ | $QM_{12}$ |
|---|---|---|---|---|---|---|---|---|---|---|---|---|
| Type | Parity | Parity | Data | Parity | Data | Data | Data | Parity | Data | Data | Data | Data |
| Memory device $302_1$ | Activated | Activated | Activated | Activated | Activated | Activated | Activated | Activated | Activated | Activated | Activated | Activated |
| Memory device $302_2$ | Activated | Activated | Activated | Activated | Activated | Activated | Activated | Tied low | Tied low | Tied low | Tied low | Tied low |

FIG. 7

ERROR CORRECTING SYSTEM SHARED BY MULTIPLE MEMORY DEVICES

BACKGROUND

The present disclosure relates to data error correction, and more particularly, to an error correcting system shared by a plurality of memory devices.

In computer storage devices where data corruption is not easily tolerated, an error correcting code (ECC) is used to detect and correct data errors introduced during data transmission or on storage. For example, ECCs can be utilized with static random access memory (SRAM) devices in applications which require high data integrity so as to enable recovery of corrupted data. With the use of ECC algorithms, a transmitter side encodes a message with redundant data, which allows a receiver side to detect and correct data errors presented in a received message. Depending on the type of an ECC algorithm used and the number of bits of the redundant data, the receiver side can detect single-bit errors or multi-bit errors.

SUMMARY

The described embodiments provide an error correcting system shared by a plurality of memory devices and a related control method.

Some embodiments described herein include an error correcting system shared by a plurality of memory devices. A data path width of each memory device has a data bit width and a parity bit width. The error correcting system includes an error correcting code (ECC) circuit and a control circuit. The ECC circuit has M input terminals. The ECC circuit is configured to encode input data received from the M input terminals to generate encoded data in response to a write operation, and output the encoded data toward the memory devices. M is a positive integer greater than one, the input data includes write data associated with the write operation, and the encoded data includes the input data and associated parity data. The control circuit is coupled to at least one of the M input terminals. When the write operation is directed to a first memory device of the memory devices having a data bit width less than M bits, the write data is inputted to a first portion of the M input terminals, the control circuit is configured to provide reference data to a second portion of the M input terminals, and the write data and the reference data serve as the input data.

Some embodiments described herein include an error correcting system shared by a plurality of memory devices. A data path width of each memory device has a data bit width and a parity bit width. The error correcting system includes an error correcting code (ECC) circuit and a control circuit. The ECC circuit has N input terminals. The ECC circuit is configured to decode input data received from the N input terminals to generate decoded data in response to a read operation. N is a positive integer greater than one, and the input data includes original data stored in a memory cell associated with the read operation and associated parity data. The control circuit is coupled to at least one of the N input terminals. When the read operation is directed to a first memory device of the memory devices having a data path width less than N bits, the read data and the parity data is inputted to a first portion of the N input terminals, the control circuit is configured to provide reference data to a second portion of the N input terminals. The original data, the parity data and the reference data serve as the input data.

With the use of reference data having a bit width which is determined according to selection of a memory device, the proposed error correcting scheme can utilize a same ECC circuit to support multiple memory devices having different data path widths and/or different data bit widths, thus saving standby power and reducing circuit areas. The error correcting scheme can serve as a centralized ECC system for multiple memory devices having different data path widths.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 illustrates an exemplary parity-check matrix of a Hamming code used in the ECC circuit shown in FIG. 3 in accordance with some embodiments of the present disclosure.

FIG. 7 illustrates an exemplary layout of terminals associated with data bits and terminals associated with parity bits of the ECC circuit shown in FIG. 3 in accordance with some embodiments of the present disclosure.

DETAILED DESCRIPTION

Figure 1:
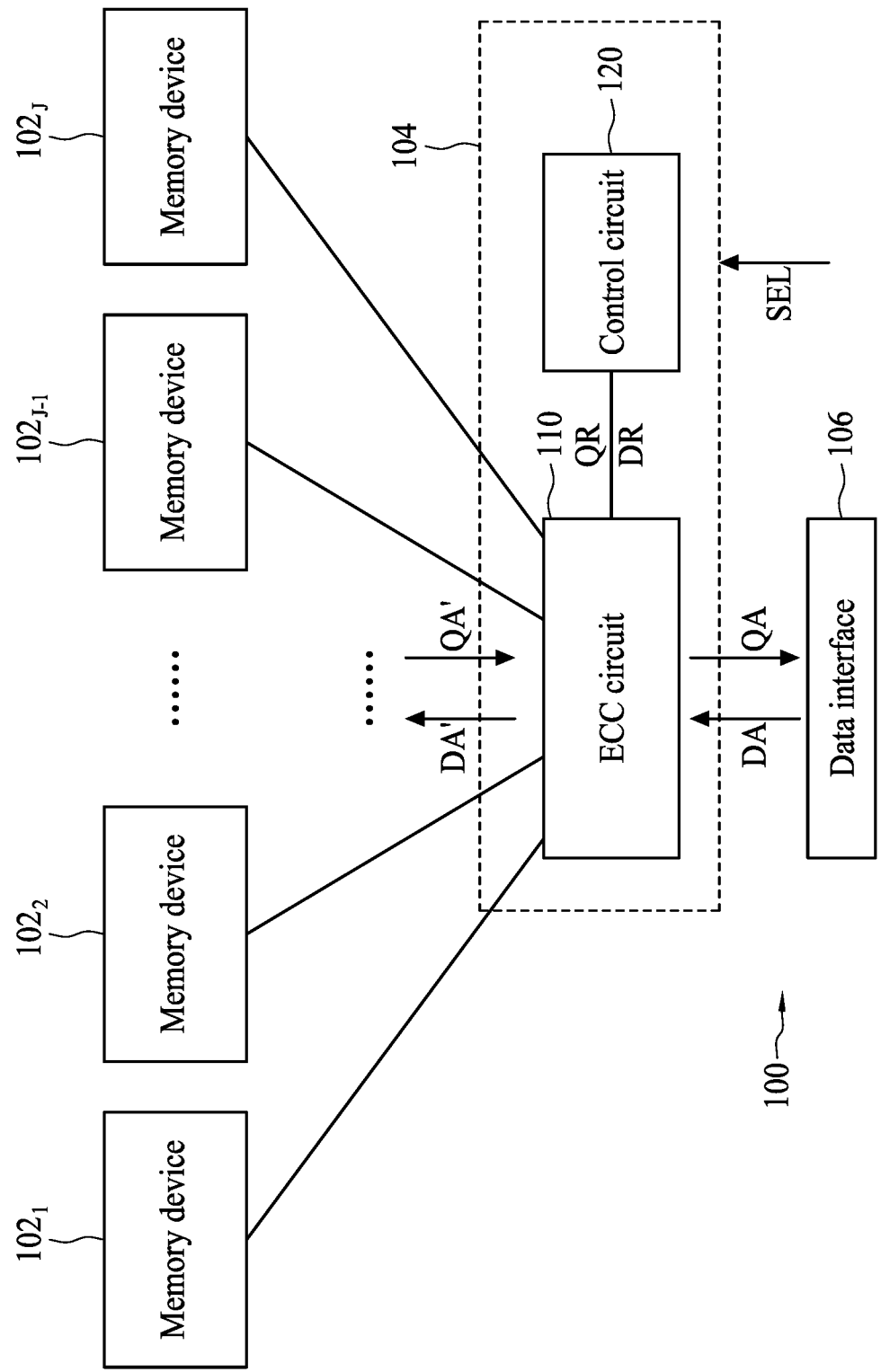
FIG. 1 is a block diagram illustrating an exemplary memory system including multiple memory devices in accordance with some embodiments of the present disclosure.

The following disclosure provides many different embodiments, or examples, for implementing different features of the provided subject matter. Specific examples of parameter values, components and arrangements are described below to simplify the present disclosure. These are, of course, merely examples and are not intended to be limiting. For example, parameter values in the description that follows may vary depending on a given technology node such as an advanced CMOS technology node, an advanced FinFET technology node or other semiconductor technology nodes. As another example, parameter values for a given technology node may vary depending on a given application or operating scenario. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

A memory system utilizing ECC schemes may include multiple memory devices which having different data path widths, also referred to as data bus widths. These memory devices are equipped with different ECC circuits respectively since each ECC circuit is dedicated to a memory device having a corresponding data path width. For example, an ECC circuit, designed to encode a k1-bit data word, is not applicable to encoding of a k2-bit data word, where k1 and k2 are different positive integers. As a result, a memory system which has different memory devices disposed on a same chip, such as a memory system of an automotive electronic system, has to employ respective dedicated ECC circuits for different data path widths, which however causes increased circuit areas and costs.

The present disclosure describes exemplary error correcting systems, each of which can be shared by a plurality of memory devices having different data path widths. In some embodiments, the exemplary error correcting system utilizes a shared ECC circuit to perform ECC operations upon different memory devices in response to different data path widths thereof. In some embodiments, the error correcting system can provide reference data to one or more input terminals thereof according to data path width information of a selected memory device, thereby performing ECC operations upon read/write data associated with the selected memory device. The error correcting system can realize a centralized ECC system for multiple memory devices.

FIG. 1 is a block diagram illustrating an exemplary memory system including multiple memory devices in accordance with some embodiments of the present disclosure. The memory system 100 can be implemented as a memory system of an electronic system, such as a memory system of an automotive electronic system having multiple memory devices for different applications, or other types of memory systems having multiple memory devices disposed therein. The memory system 100 includes, but is not limited to, a plurality of memory devices $102_1$-$102_J$, and an error correcting system 104, where J is an integer greater than one. In the present embodiment, the memory devices $102_1$-$102_J$ can operate independently of each other. At least two of the memory devices $102_1$-$102_J$ can have different data path widths, each having a data bit width and a parity bit width. Each of the memory devices $102_1$-$102_J$ can be implemented by various types of memory devices which include, for example, an SRAM device, a dynamic random access memory (DRAM) device, a magnetic random access memory (MRAM) device, a flash memory device and other types of memory devices.

The error correcting system 104 is shared by the memory devices $102_1$-$102_J$, in response to a select signal SEL indicating which one of the memory devices $102_1$-$102_J$ is selected for data access, the error correcting system 104 is configured to perform ECC operations upon associated data. The ECC operations may include, but is not limited to, encoding operations, decoding operations, error detection and error correction. In the present embodiment, the error correcting system 104 includes, but is not limited to, an ECC circuit 110 and a control circuit 120. The ECC circuit 110 is configured to encode write data DA to generate encoded data DA' in response to a write operation directed to a selected memory device, i.e. one of the memory devices $102_1$-$102_J$. The write data DA is inputted to the ECC circuit 110 through a data interface 106, such as an input/output (I/O) interface coupled to a memory controller. The encoded data DA' may include the write data DA and associated parity data. After generating the encoded data DA', the ECC circuit 110 can be configured to write the encoded data DA' into the selected memory device. Please note that a bit width of the write data DA varies in accordance with a data bit width of the selected memory device. Also, a bit width of the encoded data DA' varies in accordance with a data path width of the selected memory device.

In addition, the ECC circuit 110 is configured to decode encoded data QA' to generate read data QA in response to a read operation directed to a selected memory device, i.e. one of the memory devices $102_1$-$102_J$. The encoded data QA' may include original data, which is stored in a memory cell of the selected memory device, and associated parity data stored in the selected memory device. The ECC circuit 110 is configured to detect whether an error occurs in the original data read from the selected memory device. When an error in the encoded data QA' is detected, the ECC circuit 110 is configured to correct the error and reconstruct the original data to produce the read data QA. When no error is detected, the original data can serve as the read data QA. After generating the read data QA, the ECC circuit 110 is configured to output the read data QA to the data interface 106. Please note that a bit width of the encoded data QA' varies in accordance with a data path width of the selected memory device. Also, a bit width of the read data QA varies in accordance with a data bit width of the selected memory device.

The control circuit 120, coupled to the ECC circuit 110, is configured to selectively provide reference data to the ECC circuit 110 according to the select signal SEL during a memory access operation. When the memory access operation is directed to a memory device having a data path width less than a predetermined data path width, the control circuit 120 can be configured to provide the reference data. A bit width of the reference data can be determined according to the select signal SEL.

By way of example but not limitation, the ECC circuit 110 may be designed to encode input data having a predetermined bit width in response to a write operation. When a memory device having a data path width equal to a predetermined data path width is selected for writing, the write data DA inputted to the ECC circuit 110 may have a bit width equal to the predetermined bit width. The control circuit 120 may not provide any reference data to the ECC circuit 110. When another memory device having a data path width less than the predetermined data path width is selected for writing, the write data DA inputted to the ECC circuit 110 may have a bit width less than the predetermined bit width. The control circuit 120 can be configured to provide reference data DR to the ECC circuit 110, wherein a bit width of the reference data DR can be equal to a difference between the predetermined bit width and the bit width of the write data DA. As a result, the ECC circuit 110 can still receive input data having the predetermined bit width, i.e. the write data DA and the reference data DR.

As another example, the ECC circuit 110 may be designed to decode input data having a predetermined bit width in response to a read operation. When a memory device having a data path width equal to a predetermined data path width is selected for reading, the encoded data QA' read from the selected memory device may have a bit width equal to the predetermined bit width. The control circuit 120 may not provide any reference data to the ECC circuit 110. When another memory device having a data path width less than the predetermined data path width is selected for reading, the encoded data QA' read from the selected memory device may have a bit width less than the predetermined bit width. The control circuit 120 can be configured to provide reference signal QR to the ECC circuit 110, wherein a bit width of the reference data QR can be equal to a difference between the predetermined bit width and the bit width of the encoded data QA'. As a result, the ECC circuit 110 can still receive input data having the predetermined bit width, i.e. the encoded data QA' and the reference data QR.

In some embodiments, the control circuit 120 may provide the reference data DR/QR by coupling a reference signal, such as a reference voltage, to one or more input terminals/pins of the ECC circuit 110 according to the select signal SEL, such that the ECC circuit 110 can receive the reference data DR/QR from the one or more input terminals. The reference signal may have a reference signal level such as a logic low signal level.

With the use of reference data having a bit width which is determined according to the select signal SEL, the ECC circuit 110 can support the memory devices $102_1$-$102_J$ having different data path widths. As a result, the error correcting system 104 can serve as a centralized ECC system for multiple memory devices having different data path widths. Further description is provided below.

Figure 2:
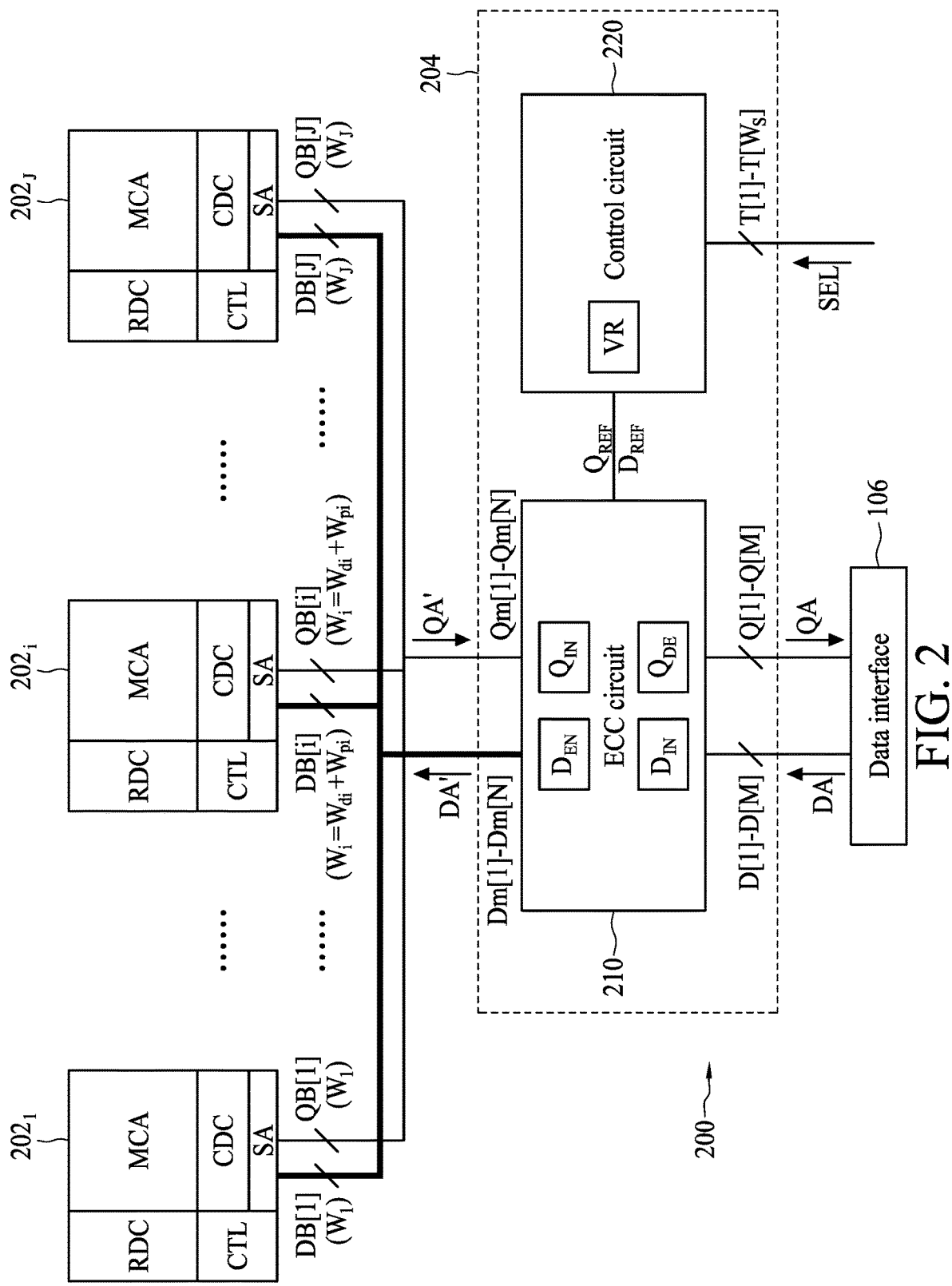
FIG. 2 illustrates an implementation of the memory system shown in FIG. 1 in accordance with some embodiments of the present disclosure.

FIG. 2 illustrates an implementation of the memory system 100 shown in FIG. 1 in accordance with some embodiments of the present disclosure. The memory system 200 may include the data interface 106 shown in FIG. 1, a plurality of memory devices $202_1$-$202_J$ and an error correcting system 204, where J is a positive integer greater than one. The memory devices $202_1$-$202_J$ can represent embodiments of the memory devices $102_1$-$102_J$ shown in FIG. 1 respectively. The error correcting system 204 can represent an embodiment of the error correcting system 104 shown in FIG. 1.

For illustrative purposes, each of the memory devices $202_1$-$202_J$ can implemented as an SRAM device. However, those skilled in the art will recognize that each of the memory devices $202_1$-$202_J$ can be implemented as other types of memory devices without departing from the scope of the present disclosure. Each of the memory devices $202_1$-$202_J$ may include, but is not limited to, a controller (CTL), a memory cell array (MCA), a row decoder (RDC), a column decoder (CDC) and a sense amplifier (SA). The controller is configured to control respective operations of the row decoder, the column decoder and the sense amplifier. The row decoder is configured to control rows of the memory cell array. The row decoder and the column decoder are configured to select memory cells of the memory cell array for read and write operations. The sense amplifier is configured to sense and amplify data stored in the memory cells of the memory cell array. As those skilled in the art should understand respective operations of a controller, a row decoder, a column decoder and a sense amplifier in an SRAM device, further description of circuit blocks in each of the memory devices $202_1$-$202_J$ is omitted here for brevity.

In the present embodiment, the memory devices $202_1$-$202_J$ have write data paths DB[1]-DB[J] respectively. At least two of the write data paths DB[1]-DB[J] have different data path widths. Also, the memory devices $202_1$-$202_J$ have read data paths QB[1]-QB[J] respectively. At least two of the read data paths QB[1]-QB[J] have different data path widths.

A write path width of a memory device may be equal to a read path width thereof. Please note that as each memory device can store parity data along with content data, i.e. data stored in a memory cell, a read/write data path of each memory device may include a data bit width and a parity bit width. The data bit width is equal to a bit width of the content data stored in the memory device, and the parity bit width is equal to a bit width of the associated parity data.

By way of example but not limitation, the write data path DB[1] has a data path width of $W_1$ bits, the write data path DB[2] has a data path width of $W_2$ bits, and so on. The read data path QB[1] has a data width of $W_1$ bits, the read data path QB[2] has a data width of $W_2$ bits, and so on. Regarding the memory device $202_i$ (i is an integer ranging from 1 to J), the write data path DB[i] thereof has a data path width of $W_i$ bits, which may be equal to a sum of a data bit width of $W_{di}$ bits and a parity bit width of $W_{pi}$ bits. The read data path QB[i] may also have a data path width of $W_i$ bits, which is equal to a sum of a data bit width of $W_{di}$ bits and a parity bit width of $W_{pi}$ bits.

The error correcting system 204 includes, but is not limited to, an ECC circuit 210 and a control circuit 220. The ECC circuit 210 and the control circuit 220 can be embodiments of the ECC circuit 110 and the control circuit 120 shown in FIG. 1 respectively. The ECC circuit 210 includes a plurality of input terminals/pins and a plurality of output terminals/pins associated with encoding and decoding operations. The number of input terminals associated with the encoding operations may be determined according to a maximum data bit width of the write data paths DB[1]-DB[J], and the number of output terminals associated with the encoding operations may be determined according to a maximum data path width of the write data paths DB[1]-DB[J]. The number of input terminals associated with the decoding operations may be determined according to a maximum data path width of the read data paths QB[1]-QB[J], and the number of output terminals associated with the decoding operations may be determined according to a maximum data bit width of the read data paths QB[1]-QB[J].

By way of example but not limitation, the ECC circuit 210 may include M input terminals D[1]-D[M] and N output terminals Dm[1]-Dm[N] associated with encoding operations, and N input terminals Qm[1]-Qm[N] and M output terminals Q[1]-Q[M] associated with decoding operations. M is a positive integer greater than one, and N is a positive integer greater than M. M can be equal to a maximum data bit width of the write data paths DB[1]-DB[J], or a maximum data bit width of the read data paths QB[1]-QB[J]. N can be equal to a maximum data path width of the write data paths DB[1]-DB[J], or a maximum data path width of the read data paths QB[1]-QB[J].

In the present embodiment, the ECC circuit 210 can be configured to, in response to a write operation, encode input data $D_{IN}$ of M bits inputted to the input terminals D[1]-D[M] to generate encoded data $D_{EN}$ of N bits, thereby outputting the encoded data $D_{EN}$ toward the memory devices $202_1$-$202_J$. The input data $D_{IN}$ includes the write data DA associated with the write operation. The encoded data $D_{EN}$ includes the input data $D_{IN}$ and associated parity data. Also, the ECC circuit 210 can be configured to, in response to a read operation, decode input data $Q_{IN}$ of N bits inputted to the input terminals Qm[1]-Qm[N] to generate decoded data $Q_{DE}$ of M bits. The input data $Q_{IN}$ includes the encoded data QA' associated with the read operation, wherein the encoded data QA' includes original data stored in a memory cell and associated parity data. The decoded data $Q_{DE}$ includes the read data QA associated with the original data. When no error is detected in the original data, the read data QA is the original data. When an error is detected in the original data, the read data QA is a corrected version of the original data.

The control circuit 220, coupled to at least one input terminal of the ECC circuit 210, is configured to selectively provide reference data to one or more input terminals of the ECC circuit 210 according to the select signal SEL. In the present embodiment, the control circuit 210 is configured to selectively couple a reference voltage VR to a portion of the input terminals D[1]-D[M] according to the select signal SEL to thereby provide reference data $D_{REF}$, which has a bit width equal to the number of input terminals coupled to the reference voltage VR. Additionally or alternatively, the control circuit 210 is configured to selectively couple the reference voltage VR to a portion of the input terminals Qm[1]-Qm[N] according to the select signal SEL to thereby to provide reference data $Q_{REF}$, which has a bit width equal to the number of input terminals coupled to the reference voltage VR.

The select signal SEL can indicate which one of the memory devices $202_1$-$202_J$ is selected. By way of example but not limitation, a bit width $W_S$ of the select signal SEL may be set to a smallest integer not less than $\log_2(J)$, such that each signal pattern of the select signal SEL can represent a selection of the memory devices $202_1$-$202_J$. The select signal SEL can be received from one or more of select pins T[1]-T[$W_S$]. As another example, the bit width of the select signal SEL may be set to J, such that each bit of the select signal SEL can indicate whether a corresponding memory device is selected. The select signal SEL can be received from one or more of select pins T[1]-T[$W_S$], where $W_S$=J.

In operation, when the memory device $202_i$ (1≤i≤J) is selected for writing, the write data DA of $WA_{di}$ bits is inputted to the ECC circuit 210, and the write data path DB[i] is configured to receive the encoded data DA' of $W_i$ bits. The control circuit 220 may determine whether to couple the reference voltage VR to one or more of the input terminals D[1]-D[M] according to the select signal SEL. By way of example but not limitation, when the select signal SEL indicates that the memory device $202_i$ having the data bit width of $W_{di}$ bits equal to M bits is selected ($W_{di}$=M), the control circuit 210 may not couple the reference voltage VR to any of the input terminals D[1]-D[M]. As a result, the ECC circuit 210 can encode the input data $D_{IN}$, i.e. the write data DA, to generate the encoded data $D_{EN}$, which is the encoded data DA' of $W_i$ bits ($W_i$=N). Next, the ECC circuit 210 can output the encoded data DA' to the write data path DB[i] through the output terminals Dm[1]-Dm[N].

As another example, when the select signal SEL indicates that the memory device $202_i$ having the data bit width of $W_{di}$ bits less than M bits is selected ($W_{di}$<M), the write data DA of $W_{di}$ bits is inputted to a portion of the input terminals D[1]-D[M], i.e. $W_{di}$ input terminals of the input terminals D[1]-D[M]. The control circuit 210 can be configured to couple the reference voltage VR to another portion of the input terminals D[1]-D[M], e.g. the remaining (M-$W_{di}$) input terminals of the input terminals D[1]-D[M], thereby providing the reference data $D_{REF}$ of (M-$W_{di}$) bits. As a result, the ECC circuit 210 can encode the input data $D_{IN}$, i.e. the write data DA and the reference data $D_{REF}$, to generate the encoded data $D_{EN}$, which includes the encoded data DA' of $W_i$ bits and auxiliary data of (N-$W_i$) bits ($W_i$<N). Next, the ECC circuit 210 can output the encoded data DA' to the write data path DB[i] through $W_i$ output terminals of the output terminals Dm[1]-Dm[N].

When the memory device $202_i$ (1≤i≤J) is selected for reading, the encoded data QA' of $W_i$ bits is inputted from the read data path QB [i] to the ECC circuit 210, and the read data QA of $W_{di}$ bits is outputted from the ECC circuit 210. The control circuit 220 may determine whether to couple the reference voltage VR to one or more of the input terminals Qm[1]-Qm[M] according to the select signal SEL. By way of example but not limitation, when the select signal SEL indicates that the memory device $202_i$ having the data path width of $W_i$ bits equal to N bits is selected ($W_i$=N), the control circuit 210 may not couple the reference voltage VR to any of the input terminals Qm[1]-Qm[M]. As a result, the ECC circuit 210 can decode the input data $Q_{IN}$, i.e. the encoded data QA' received from the read data path QB[i], to generate the decoded data $Q_{DE}$, which is the read data QA of $W_{di}$ bits ($W_{di}$=M). Next, the ECC circuit 210 can output the read data QA through the output terminals Q[1]-Q[M].

As another example, when the select signal SEL indicates that the memory device $202_i$ having the data path width of $W_i$ bits less than N bits is selected ($W_i$<N), the encoded data QA' of $W_i$ bits is inputted to a portion of the input terminals Qm[1]-Qm[N], i.e. $W_i$ input terminals of the input terminals Qm[1]-Qm[N]. The control circuit 210 can be configured to couple the reference voltage VR to another portion of the input terminals Qm[1]-Qm[N], i.e. the remaining (N-$W_i$) input terminals of the input terminals Qm[1]-Qm[N], thereby providing the reference data $Q_{REF}$ of (N-$W_i$) bits. As a result, the ECC circuit 210 can decode the input data $Q_{IN}$, i.e. the encoded data QA' and the reference data $Q_{REF}$, to generate the decoded data $Q_{DE}$, which includes the read data QA of $W_{di}$ bits and auxiliary data of (M-$W_{di}$) bits ($W_{di}$<M). Next, the ECC circuit 210 can output the read data QA through (M-$W_{di}$) output terminals of the output terminals Q[1]-Q[M].

As the control circuit 220 is capable of providing the reference data $D_{REF}$/$Q_{REF}$ which has a bit width determined according to the select signal SEL, the ECC circuit 210 can serve as a centralized ECC circuit capable of supporting multiple memory devices having different data path widths.

To facilitate understanding of the present disclosure, some embodiments are given in the following for further description of the centralized ECC scheme. Those skilled in the art should appreciate that other embodiments employing the error correcting system 104 shown in FIG. 1 or the error correcting system 204 shown in FIG. 2 are also within the contemplated scope of the present disclosure.

Figure 3:
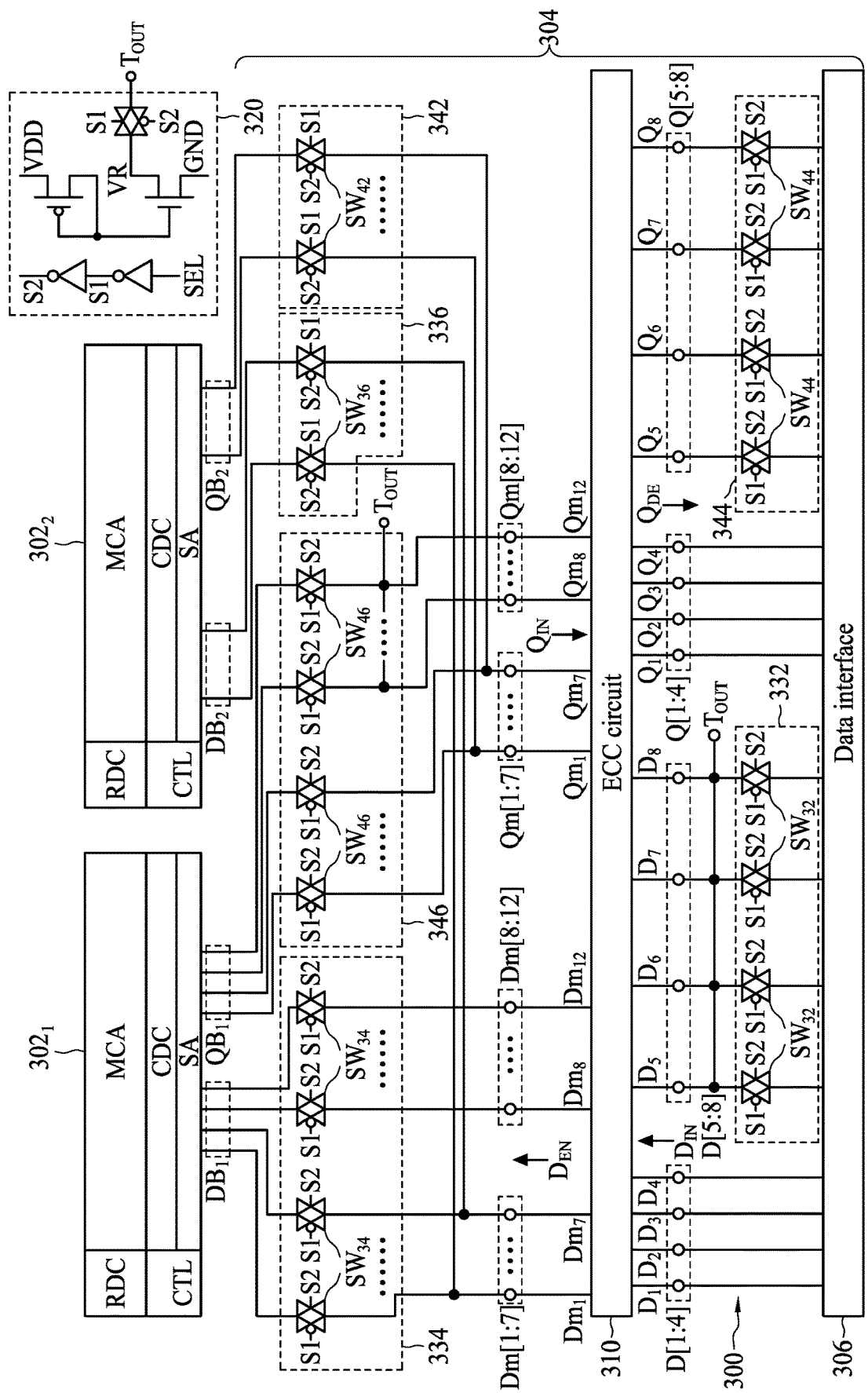
FIG. 3 illustrates an implementation of the memory system shown in FIG. 2 in accordance with some embodiments of the present disclosure.

FIG. 3 illustrates an implementation of the memory system 200 shown in FIG. 2 in accordance with some embodiments of the present disclosure. The memory system 300 may include a plurality of memory devices $302_1$ and $302_2$, and an error correcting system 304. The memory devices $302_1$ and $302_2$ can represent embodiments of any two of the memory devices $202_1$-$202_J$ shown in FIG. 2. The error correcting system 304 can represent an embodiment of the error correcting system 204 shown in FIG. 2.

In the present embodiment, the memory device $302_1$ can store 8-bit content data and associated 4-bit parity data in response to a write operation. Each of a write data path $DB_1$ and a read data path $QB_1$ of the memory device $302_1$ may have a 12-bit data path width including an 8-bit data bit width and a 4-bit parity bit width. In addition, the memory device $302_2$ can store 4-bit content data and associated 3-bit parity data in response to a write operation. Each of a write data path $DB_2$ and a read data path $QB_2$ of the memory device $302_2$ may have a 7-bit data path width including a 4-bit data bit width and a 3-bit parity bit width. Please note that the write data path width, the read data path width, the data bit width and the parity bit width described above are for illustrative purposes only, and are not intended to limit the scope of the present disclosure. Those skilled in the art will recognize that the memory device $302_1/302_2$ can be implemented by a memory device have a different data path width, data bit width and/or parity bit width without departing from the scope of the present disclosure.

The error correcting system 304 may include an ECC circuit 310, a control circuit 320, and a plurality of switch circuits 332-336 and 342-346. The ECC circuit 310 and the control circuit 320 can represent embodiments of the ECC circuit 210 and the control circuit 220 shown in FIG. 2 respectively. The ECC circuit 310 includes a plurality of input terminals $D_1$-$D_8$, a plurality of output terminals $Dm_1$-$Dm_{12}$, a plurality of input terminals $Qm_1$-$Qm_{12}$ and a plurality of output terminals $Q_1$-$Q_8$. The ECC circuit 310 is configured to encode the input data $D_{IN}$ received from the input terminals $D_1$-$D_8$ to generate the encoded data $D_{EN}$ in response to a write operation, thereby outputting the encoded data $D_{EN}$ from the output terminals $Dm_1$-$Dm_{12}$. Also, the ECC circuit 310 is configured to decode the input data $Q_{IN}$ received from the input terminals $Qm_1$-$Qm_{12}$ to generate the decoded data $Q_{DE}$ in response to a read operation, thereby outputting the decoded data $Q_{DE}$ from the output terminals $Q_1$-$Q_8$.

The input terminals $D_1$-$D_8$ can represent an embodiment of at least a portion of the input terminals D[1]-D[M] shown in FIG. 2, and the output terminals $Dm_1$-$Dm_{12}$ can represent an embodiment of at least a portion of the output terminals Dm[1]-Dm[N] shown in FIG. 2 (i.e. M=8 and N=12). The input terminals $Qm_1$-$Qm_{12}$ can represent an embodiment of at least a portion of the input terminals Qm[1]-Qm[N] shown in FIG. 2, and the output terminals $Q_1$-$Q_8$ can represent an embodiment of at least a portion of the output terminals Q[1]-Q[M] shown in FIG. 2.

The number of terminals of the input terminals $D_1$-$D_8$ can be determined according to the maximum number of bits of content data stored in a memory cell. In the present embodiment, the number of terminals of the input terminals $D_1$-$D_8$ is equal to the number of bits of content data stored in a memory cell of the memory device $302_1$. In addition, the input terminals $D_1$-$D_8$ may include a first input terminal group D[1:4] having the input terminals $D_1$-$D_4$ and a second input terminal group D[5:8] having the input terminals $D_5$-$D_8$. The number of terminals in the first input terminal group D[1:4] is determined according to the number of bits of content data stored in a memory cell of the memory device $302_2$, which has a data bit width less than a data bit width of the memory device $302_1$.

The number of terminals of the output terminals $Dm_1$-$Dm_{12}$ can be determined according to according to the maximum total number of bits of content data stored in a memory cell and associated parity data. In the present embodiment, the number of terminals of the output terminals $Dm_1$-$Dm_{12}$ is equal to the total number of bits of content data stored in a memory cell and associated parity data of the memory device $302_1$. In addition, the output terminals $Dm_1$-$Dm_{12}$ may include a first output terminal group Dm[1:7] having the output terminals $Dm_1$-$Dm_7$ and a second output terminal group Dm[8:12] having the input terminals $Dm_8$-$Dm_{12}$. The number of terminals in the first output terminal group Dm[1:7] is determined according to the total number of bits of content data stored in a memory cell and associated parity data of the memory device $302_2$, which has a write data path width less than a write data path width of the memory device $302_1$.

The number of terminals of the input terminals $Qm_1$-$Qm_{12}$ can be determined according to according to the maximum total number of bits of content data stored in a memory cell and associated parity data. In the present embodiment, the number of terminals of the input terminals $Qm_1$-$Qm_{12}$ is equal to the total number of bits of content data stored in a memory cell and associated parity data of the memory device $302_1$. In addition, the input terminals $Qm_1$-$Qm_{12}$ may include a first output terminal group Qm[1:7] having the output terminals $Qm_1$-$Qm_7$ and a second output terminal group Qm[8:12] having the input terminals $Qm_8$-$Qm_{12}$. The number of terminals of the first output terminal group Qm[1:7] is determined according to the total number of bits of content data stored in a memory cell and associated parity data of the memory device $302_2$, which has a read data path width less than a read data path width of the memory device $302_1$.

The number of terminals of the output terminals $Q_1$-$Q_8$ can be determined according to the maximum number of bits of content data stored in a memory cell. In the present embodiment, the number of terminals of the output terminals $Q_1$-$Q_8$ is equal to the number of bits of content data stored in a memory cell of the memory device $302_1$. In addition, the output terminals $Q_1$-$Q_8$ may include a first output terminal group Q[1:4] having the output terminals $Q_1$-$Q_4$ and a second output terminal group Q[5:8] having the output terminals $Q_5$-$Q_8$. The number of terminals of the first output terminal group Q[1:4] is determined according to the number of bits of content data stored in a memory cell of the memory device $302_2$, which has a data bit width less than a data bit width of the memory device $302_1$.

The control circuit 320 has a signal output terminal $T_{OUT}$ coupled to the second input terminal groups D[5:8] and Qm[8:12]. The control circuit 320 is configured to selectively apply the reference voltage VR to the signal output terminal $T_{OUT}$ according to the select signal SEL that indicates which one of the memory devices $302_1$ and $302_2$ is selected. The select signal SEL can be received from a select pin $T_{SEL}$ of the control circuit 320.

In the present embodiment, the control circuit 320 can include, but is not limited to, a plurality of inverters 322 and 324, a switch 326, and a plurality of transistors M1 and M2. The inverter 322 is configured to invert the select signal SEL to generate a select signal S1. The inverter 324 is configured to invert the select signal S1 to generate a select signal S2. A source of the transistor M1 is coupled to a supply voltage VDD, and a gate of the transistor M1 is coupled to a drain thereof. A source of the transistor M2 is coupled to a reference voltage such as a ground voltage GND, and a gate of the transistor M2 is coupled to the gate of the transistor M1. The switch 326 is selectively coupled between a drain of the transistor M2 and the signal output terminal $T_{OUT}$ according to the select signal SEL. When the switch 326 is switched on, a signal level of the signal output terminal $T_{OUT}$ can be tied to the reference voltage VR, which is equal to or substantially equal to the ground voltage GND. By way of example but not limitation, the switch 326 can be implemented by a transmission gate, which is turned on when the select signal S1 has a high signal level or the select signal S2 has a low signal level. Those skilled in the art should appreciate that the switch 326 can be implemented by other types of switch elements without departing from the scope of the present disclosure.

The switch circuit 332 is configured to selectively couple the second input terminal group D[5:8] to a data interface 306, such as an input/output (I/O) interface coupled to a memory controller. The switch circuit 334 is configured to selectively couple the output terminals $Dm_1$-$Dm_{12}$, i.e. the first output terminal group Dm[1:7] and the second output terminal group Dm[8:12], to the memory device $302_1$. The switch circuit 336 is configured to selectively couple the first output terminal group Dm[1:7] to the memory device $302_2$. In the present embodiments, the switch circuit 332 may include a plurality of switches $SW_{32}$, which are disposed in correspondence with the input terminals $D_5$-$D_8$ respectively. The switch circuit 334 may include a plurality of switches $SW_{34}$, which are disposed in correspondence with the output terminals $Dm_1$-$Dm_{12}$ respectively. The switch circuit 336 may include a plurality of switches $SW_{36}$, which are disposed in correspondence with the output terminals $Dm_1$-$Dm_7$ respectively. Each of the switches $SW_{32}$ and $SW_{34}$ can be implemented by a transmission gate, which is turned on when the select signal S1 has a low signal level or the select signal S2 has a high signal level. Each of the switches $SW_{36}$ can be implemented by a transmission gate, which is turned on when the select signal S1 has a high signal level or the select signal S2 has a low signal level. It is worth noting that those skilled in the art should appreciate that at least one of the switches $SW_{32}$, $SW_{34}$ and $SW_{36}$ can be implemented by other types of switch elements without departing from the scope of the present disclosure.

The switch circuit 342 is configured to selectively couple the first input terminal group Qm[1:7] to the memory device $302_2$. The switch circuit 344 is configured to selectively couple the second output terminal group Q[5:8] to the data interface 306. The switch circuit 346 is configured to selectively couple the input terminals $Qm_1$-$Qm_{12}$, i.e. the first input terminal group Qm[1:7] and the second input terminal group Qm[8:12], to the memory device $302_1$. In the present embodiments, the switch circuit 342 may include a plurality of switches $SW_{42}$, which are disposed in correspondence with the input terminals $Qm_1$-$Qm_7$ respectively. The switch circuit 344 may include a plurality of switches $SW_{44}$, which are disposed in correspondence with the output terminals $Q_5$-$Q_8$ respectively. The switch circuit 346 may include a plurality of switches $SW_{46}$, which are disposed in correspondence with the input terminals $Qm_1$-$Qm_{12}$ respectively. Each of the switches $SW_{42}$ can be implemented by a transmission gate, which is turned on when the select signal S1 has a high signal level or the select signal S2 has a low signal level. Each of the switches $SW_{44}$ and $SW_{46}$ can be implemented by a transmission gate, which is turned on when the select signal S1 has a low signal level or the select signal S2 has a high signal level. It is worth noting that those skilled in the art should appreciate that at least one of the switches $SW_{42}$, $SW_{44}$ and $SW_{46}$ can be implemented by other types of switch elements without departing from the scope of the present disclosure.

Figure 4:
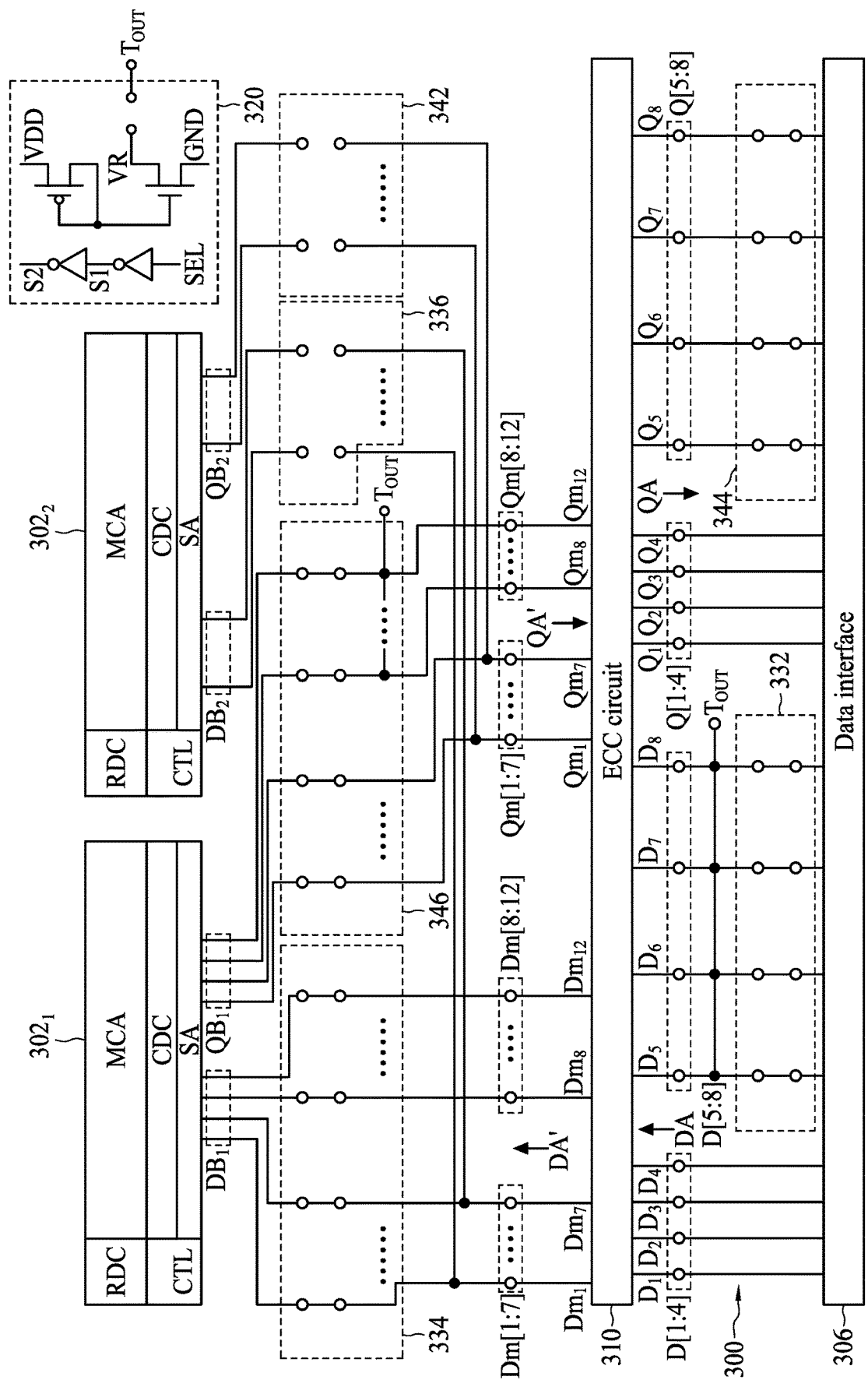
FIG. 4 illustrates circuit configuration of the memory system shown in FIG. 3 during data access operations directed to the memory device in accordance with some embodiments of the present disclosure.

In operation, when the memory device $302_1$ is selected, the select signal SEL can have a high signal level, such that the select signal S1 has a low signal level and the select signal S2 has a high signal level. When the memory device $302_2$ is selected, the select signal SEL can have a low signal level, such that the select signal S1 has a high signal level and the select signal S2 has a low signal level. Firstly, referring to FIG. 4, circuit configuration of the memory system 300 shown in FIG. 3 during data access operations directed to the memory device $302_1$ is illustrated in accordance with some embodiments of the present disclosure. In the present embodiment, when the memory device $302_1$ is selected for writing, the signal output terminal $T_{OUT}$ can be set to a high impedance state since the switch 326 is turned off. The switch circuit 332 is configured to couple the second input terminal group D[5:8] to the data interface 306, such that the write data DA of 8 bits is inputted to the input terminals $D_1$-$D_8$ through the data interface 306. The ECC circuit 310 may encode the write data DA to generate the encoded data DA' of 12 bits. In addition, the switch circuit 334 is configured to couple the first output terminal group Dm[1:7] and the second output terminal group Dm[8:12] to the memory device $302_1$. The switch circuit 336 is configured to uncouple the first output terminal group Dm[1:7] from the memory device $302_2$. As a result, the memory device $302_1$ can receive the encoded data DA' from the output terminals $Dm_1$-$Dm_{12}$ through the write data path $DB_1$.

When the memory device $302_1$ is selected for reading, the signal output terminal $T_{OUT}$ can be set to a high impedance state since the switch 326 is turned off. The switch circuit 346 is configured to couple the first input terminal group Qm[1:7] and the second input terminal group Qm[8:12] to the memory device $302_1$, such that the encoded data QA' of 12 bits is inputted to the input terminals $Qm_1$-$Qm_{12}$ from the memory device $302_1$. The ECC circuit 310 may decode the encoded data QA' to generate the read data QA of 8 bits. In addition, the switch circuit 344 is configured to couple the second output terminal group Q[5:8] to the data interface 306. The switch circuit 342 is configured to uncouple the first input terminal group Qm[1:7] from the memory device $302_2$. As a result, the ECC circuit 310 can output the read data QA from the output terminals $Q_1$-$Q_8$ to the data interface 306.

Figure 5:
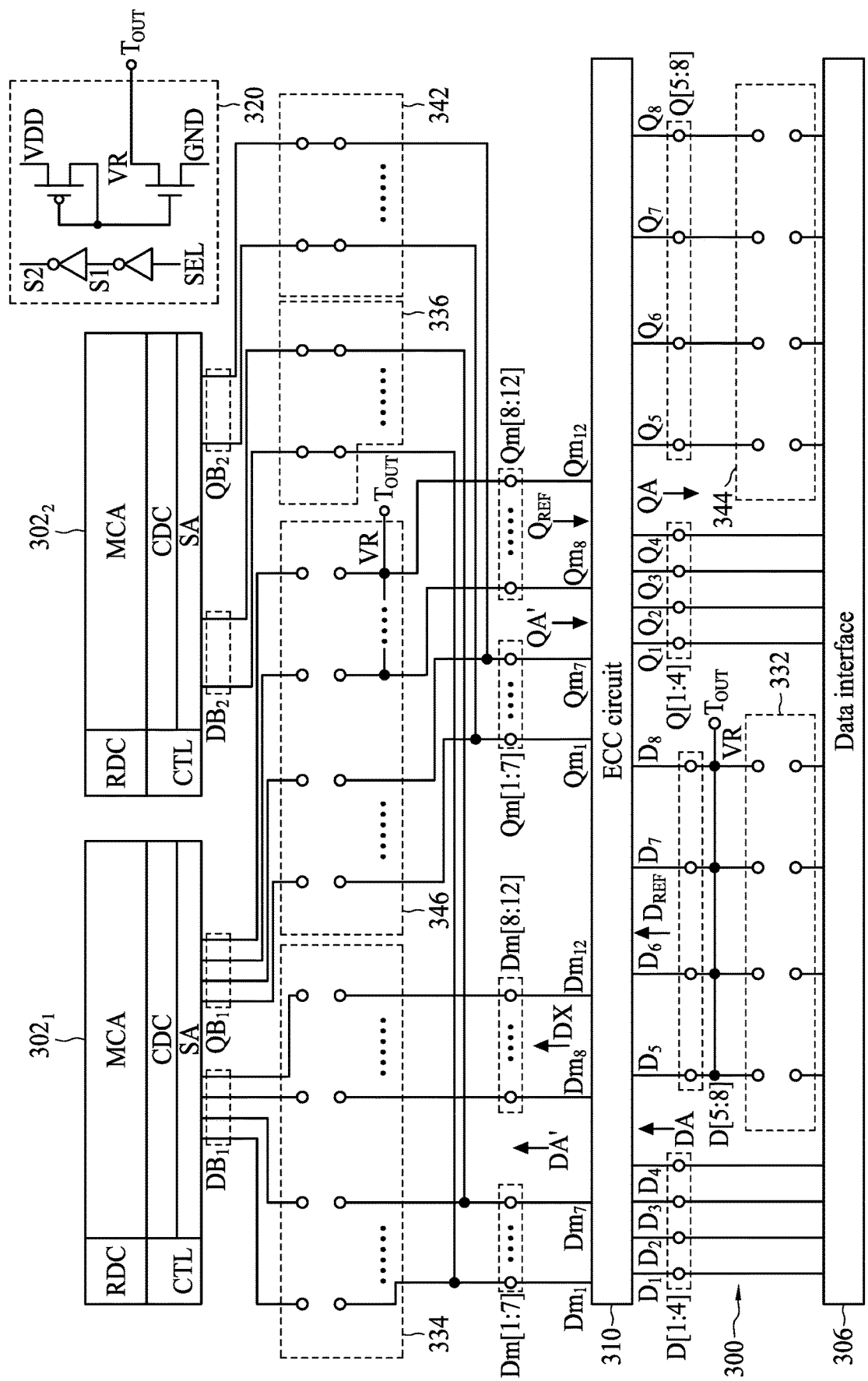
FIG. 5 illustrates circuit configuration of the memory system shown in FIG. 3 during data access operations directed to the memory device in accordance with some embodiments of the present disclosure.

Referring to FIG. 5, circuit configuration of the memory system 300 shown in FIG. 3 during data access operations directed to the memory device $302_2$ is illustrated in accordance with some embodiments of the present disclosure. In the present embodiment, when the memory device $302_2$ is selected for writing, the signal output terminal $T_{OUT}$ can be coupled to the reference voltage VR since the switch 326 is turned on. The switch circuit 332 is configured to uncouple the second input terminal group D[5:8] from the data interface 306, such that the write data DA of 4 bits is inputted to the input terminals $D_1$-$D_4$ and the reference data $D_{REF}$ of 4 bits is inputted to the input terminals $D_5$-$D_8$. As the reference voltage VR can be equal to or substantially equal to the ground voltage GND, each bit of the reference data $D_{REF}$ may have a logic low value. The ECC circuit 310 may encode the input data $D_{IN}$ of 8 bits, i.e. the write data DA and the reference data $D_{REF}$, to generate the encoded data $D_{EN}$ of 12 bits, which includes the encoded data DA' of 7 bits and auxiliary data DX of 5 bits. In addition, the switch circuit 334 is configured to uncouple the first output terminal group Dm[1:7] and the second output terminal group Dm[8:12] from the memory device 302. The switch circuit 336 is configured to couple the first output terminal group Dm[1:7] to the memory device $302_2$. As a result, the memory device $302_2$ can receive the encoded data DA' from the output terminals $Dm_1$-$Dm_7$ through the write data path $DB_2$.

When the memory device $302_2$ is selected for reading, the signal output terminal $T_{OUT}$ can be coupled to the reference voltage VR since the switch 326 is turned on. The input terminals $Qm_8$-$Qm_{12}$ coupled to the signal output terminal $T_{OUT}$ can receive the reference data $Q_{REF}$ of 5 bits. The switch circuit 342 is configured to couple the first input terminal group Qm[1:7] to the memory device $302_2$, such that the encoded data QA' of 7 bits is inputted to the input terminals $Qm_1$-$Qm_7$ from the memory device $302_2$. The ECC circuit 310 may decode the input data $Q_{IN}$ of 12 bits, i.e. the encoded data QA' and the reference data $Q_{REF}$, to generate the decoded data $Q_{DE}$ of 8 bits, which includes the read data QA of 4 bits and auxiliary data QX of 4 bits. In addition, the switch circuit 344 is configured to uncouple the second output terminal group Q[5:8] from the data interface 306. The switch circuit 346 is configured to uncouple the first input terminal group Qm[1:7] and the second input terminal group Qm[8:12] from the memory device $302_1$. As a result, the ECC circuit 310 can output the read data QA from the output terminals $Q_1$-$Q_4$ to the data interface 306.

It is worth noting that the auxiliary data DX produced during write operations can be discarded without affecting the encoding result of the write data DA. Also, the auxiliary data QX produced during read operations can be discarded without affecting the decoding result of the encoded data QA'.

Referring to FIG. 6 and also to FIG. 3. FIG. 6 illustrates an exemplary parity-check matrix H1 of a Hamming (15,11) code with block length 15 and message length 11 used in the ECC circuit 310 shown in FIG. 3 in accordance with some embodiments of the present disclosure. The ECC circuit 310 can utilize the parity-check matrix H1 to encode a first massage having a data bit width ranging from 5 to 11 bits, such as write data associated with the memory device $302_1$, and decode associated encoded message such as encoded data stored in the memory device $302_1$. When configured to process a second massage having a data bit width less than 5 bits, such as write data associated with the memory device $302_2$, the ECC circuit 310 can still properly encode the second message by utilizing the same parity-check matrix H1. For example, the ECC circuit 310 can receive the reference data $D_{REF}$ which is combined with or attached to the second message, and encode the second message and the reference data $D_{REF}$ according to the same parity-check matrix H1. Since each bit of the reference data $D_{REF}$ can have a predetermined value, such as a logic low value, which will not affect the result of the exclusive-OR operation involved in encoding/decoding, the second message having the data bit width less than 5 bits can be properly encoded using a submatrix H2 of the parity-check matrix H1. As a result, the error correcting system 300 can utilize the same ECC circuit 310, rather than an ECC circuit utilizing a Hamming (15,11) code and another ECC circuit utilizing a Hamming (7,4) code, to support the memory devices $302_1$ and $302_2$ having different data path widths.

FIG. 7 illustrates an exemplary layout of terminals associated with data bits and terminals associated with parity bits of the ECC circuit 310 shown in FIG. 3 in accordance with some embodiments of the present disclosure. In the present embodiment, the ECC circuit 310 can utilize a Hamming code to perform ECC operations. The output terminals arranged to output parity bits are the output terminals $Dm_1$, $Dm_2$, $Dm_4$ and $Dm_8$, each of which corresponds to a position of a power of two. The remaining output terminals of the output terminals $Dm_1$-$Dm_{12}$ are arranged to output data bits. By way of example but not limitation, when the ECC circuit 310 is applied to a write operation directed to the memory device $302_1$, each of the output terminals $Dm_1$-$Dm_{12}$ is activated to output a corresponding bit value. When the ECC circuit 310 is applied to a write operation directed to the memory device $302_2$, a portion of the output terminals $Dm_1$-$Dm_{12}$, i.e. the output terminals $Dm_1$-$Dm_7$, are activated to output corresponding bit values, while another portion of the output terminals $Dm_1$-$Dm_{12}$, i.e. the output terminals $Dm_8$-$Dm_{12}$, are tied to the reference voltage VR such as a logic low level.

The input terminals arranged to receive parity bits are the input terminals $Qm_1$, $Qm_2$, $Qm_4$ and $Qm_8$, each of which corresponds to a position of a power of two. The remaining input terminals of the input terminals $Qm_1$-$Qm_{12}$ are arranged to receive data bits. By way of example but not limitation, when the ECC circuit 310 is applied to a read operation directed to the memory device $302_1$, each of the input terminals $Qm_1$-$Qm_{12}$ is activated to receive a corresponding bit value. When the ECC circuit 310 is applied to a read operation directed to the memory device $302_2$, a portion of the input terminals $Qm_1$-$Qm_{12}$, i.e. the input terminals $Qm_1$-$Qm_7$, are activated to receive corresponding bit values, while another portion of the input terminals $Qm_1$-$Qm_{12}$, i.e. the input terminals $Qm_8$-$Qm_{12}$, are tied to the reference voltage VR such as a logic low level to receive bit values of the reference data $Q_{REF}$.

It is worth noting that the above is for illustrative purposes only, and is not intended to limit the scope of the present disclosure. In some embodiments, other parity-check matrices of the Hamming code can be utilized for ECC operations without departing from the scope of the present disclosure. In some embodiments, the proposed error correcting scheme can utilize other types of ECC codes, such as low density parity check (LDPC) codes and Reed Solomon (RS) codes. In some embodiments, the proposed error correcting scheme can have a different layout of input/output terminals which are disposed between an ECC circuit and a memory device. In some embodiments, the control circuit 320 shown in FIG. 3 to FIG. 5 can utilize different circuit structures to provide the reference voltage VR. In some embodiments, the control circuit 320 shown in FIG. 3 to FIG. 5 can utilize different circuit structures to control switching operations of the switch circuits 332-336 and 342-346.

Figure 8:
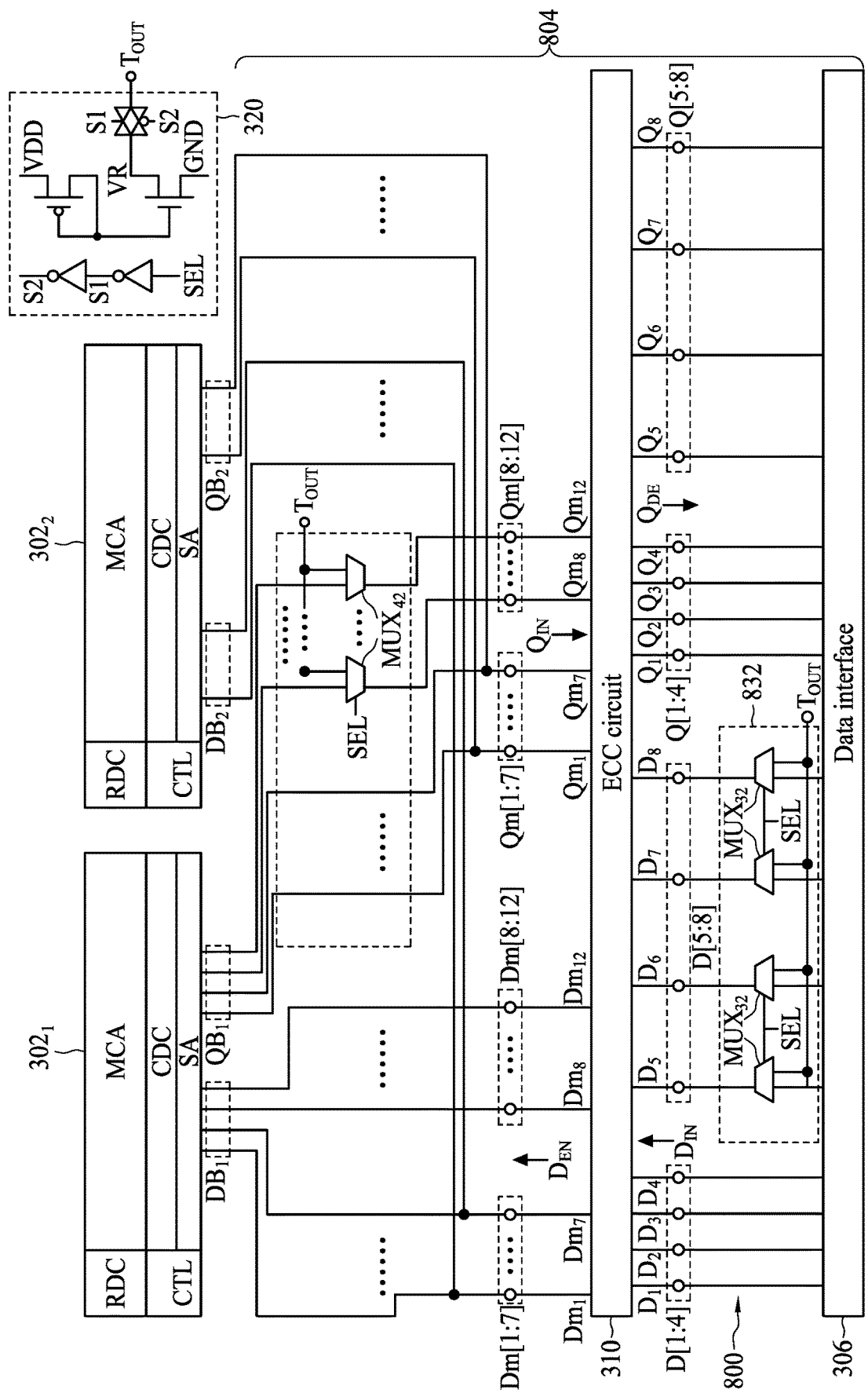
FIG. 8 illustrates another implementation of the memory system shown in FIG. 2 in accordance with some embodiments of the present disclosure.

In some embodiments, at least one of the switch circuits shown in FIG. 3 is optional. FIG. 8 illustrates another implementation of the memory system 200 shown in FIG. 2 in accordance with some embodiments of the present disclosure. The structure of the memory system 800 is similar/identical to the structure of the memory system 300 shown in FIG. 3 except that the output terminals $Dm_1$-$Dm_{12}$ can be directly coupled to the write data path DB and that the output terminals $Dm_1$-$Dm_7$ can be directly coupled to the write data path $DB_2$. Also, the input terminals $Qm_1$-$Qm_7$ can be directly coupled to the memory device $302_1$, and the input terminals $Qm_1$-$Qm_7$ can be directly coupled to the read data path $QB_2$. Further, the output terminals $Q_5$-$Q_8$ can be directly coupled to the data interface 306.

In the present embodiment, the error correcting system 804 may include a plurality of switch circuits 832 and 842. The switch circuit 832 is configured to couple one of the data interface 306 and the reference voltage VR to each of the input terminals $D_5$-$D_8$. The switch circuit 832 may include a plurality of multiplexers $MUX_{32}$, which are disposed in correspondence with the input terminals $D_5$-$D_8$ respectively. By way of example but not limitation, when the select signal SEL has a high signal level, each of the multiplexers $MUX_{32}$ is configured to couple the data interface 306 to a corresponding input terminal. When the select signal SEL has a low signal level, each of the multiplexers $MUX_{32}$ is configured to couple the reference voltage VR to a corresponding input terminal.

The switch circuit 842 is configured to couple one of the memory device $302_1$ and the reference voltage VR to each of the input terminals $Qm_8$-$Qm_{12}$. The switch circuit 842 may include a plurality of multiplexers $MUX_{42}$, which are disposed in correspondence with the input terminals $Qm_8$-$Qm_{12}$ respectively. By way of example but not limitation, when the select signal SEL has a high signal level, each of the multiplexers $MUX_{42}$ is configured to couple the memory device $302_1$ to a corresponding input terminal. When the select signal SEL has a low signal level, each of the multiplexers $MUX_{42}$ is configured to couple the reference voltage VR to a corresponding input terminal.

It is worth noting that, when one of the memory devices $302_1$ and $302_2$ is selected for writing, the other of the memory devices $302_1$ and $302_2$ may not be able to receive resulting encoded data, which is associated with the one of the memory devices $302_1$ and $302_2$, since the other of the memory devices $302_1$ and $302_2$ is not enabled or activated. As a result, the output terminals $Dm_1$-$Dm_{12}$ can be directly coupled to the write data path $DB_1$, and the output terminals $Dm_1$-$Dm_7$ can be directly coupled to the write data path $DB_2$ without affecting the resulting encoded data. Similarly, when one of the memory devices $302_1$ and $302_2$ is selected for reading, the other of the memory devices $302_1$ and $302_2$ may not be able to provide encoded data to the ECC circuit 310 since the other of the memory devices $302_1$ and $302_2$ is not enabled or activated. As a result, the input terminals $Qm_1$-$Qm_7$ can be directly coupled to the memory device $302_1$, and the input terminals $Qm_1$-$Qm_7$ can be directly coupled to the read data path $QB_2$ without affecting resulting read data. Also, when the memory device $302_2$ is selected for reading, the output terminals $Q_5$-$Q_8$ can be directly coupled to the data interface 306 since the data interface 306 can be configured not to receive data output from the output terminals $Q_5$-$Q_8$.

As those skilled in the art should understand the operation of the memory system 800 after reading the above paragraphs directed to FIG. 1 to FIG. 7, further description is omitted for the sake of brevity.

Figure 9:
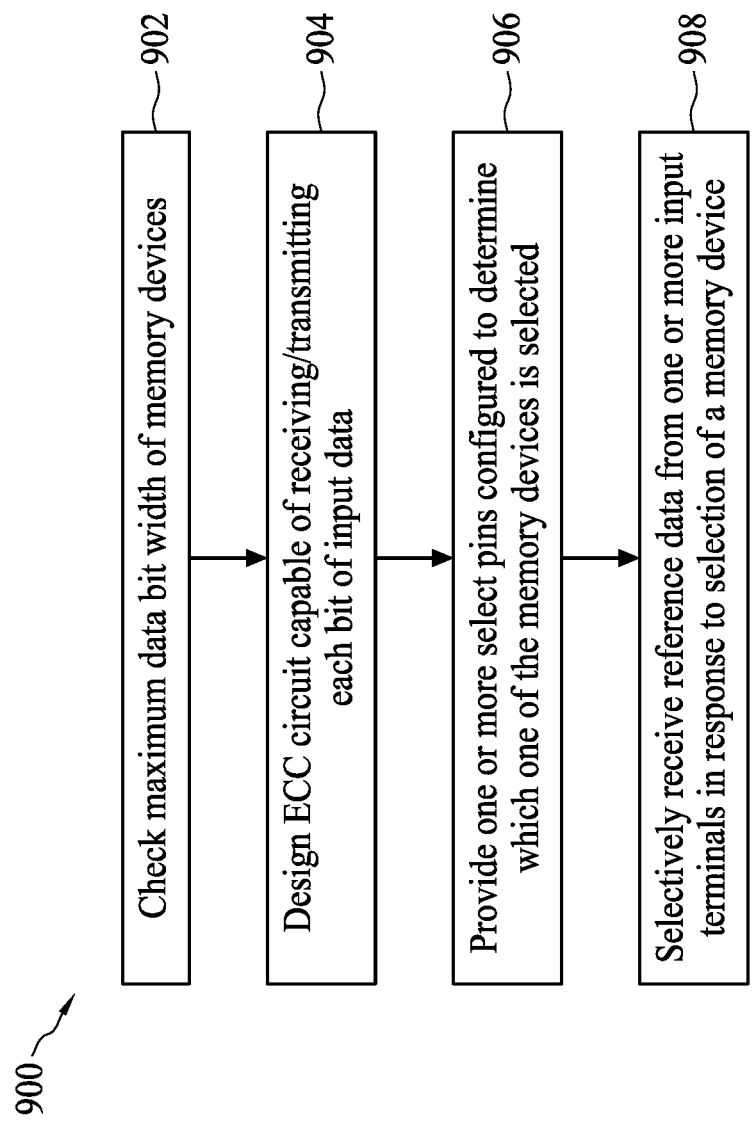
FIG. 9 is a flowchart of an exemplary error correcting method for multiple memory devices having different data path widths in accordance with some embodiments of the present disclosure.

FIG. 9 is a flowchart of an exemplary error correcting method for multiple memory devices having different data path widths in accordance with some embodiments of the present disclosure. For illustrative purposes, the error correcting method 900 is described with reference to the memory system 300 shown in FIG. 3. Those skilled in the art will recognize that the error correcting method 900 can be utilized to control the memory system 100 shown in FIG. 1 and/or the memory system 200 shown in FIG. 2 without departing from the scope of the present disclosure. Additionally, in some embodiments, other operations in the error correcting method 900 can be performed. In some embodiments, operations of the error correcting method 900 can be performed in a different order and/or vary.

At operation 902, a maximum data bit width of the memory devices is checked. For example, as the memory devices $302_1$ have the data bit width of 8 bits and the memory devices $302_2$ have the data bit width of 4 bits, a maximum data bit width of the memory devices $302_1$ and $302_2$ is equal to 8 bits.

At operation 904, an ECC circuit is designed to be able to receive/transmit each bit of input data, which is produced in response to a memory access operation directed to a memory device having the maximum data bit width. For example, the ECC circuit 310 is designed to include the input terminals $D_1$-$D_8$ to receive 8-bit write data associated with the memory device $302_1$, and the output terminals $Dm_1$-$Dm_{12}$ to transmit 12-bit encoded data associated with the memory device $302_1$. As another example, the ECC circuit 310 is designed to include the input terminals $Qm_1$-$Qm_{12}$ to receive 12-bit encoded data read from the memory device $302_1$, and the output terminals $Q_1$-$Q_8$ to transmit 8-bit read data associated with the memory device $302_1$.

At operation 906, one or more select pins are provided to determine which one of the memory devices is selected. For example, a single select pin, i.e. the select pin $T_{SEL}$, is provided to select one of the two memory devices $302_1$ and $302_2$.

At operation 908, one or more input terminals are configured to selectively receive reference data in response to selection of a memory device. For example, each of the input terminals $D_5$-$D_8$ is configured to selectively receive the reference data $D_{REF}$ according to the select signal SEL. As another example, each of the input terminals $Qm_8$-$Qm_{12}$ is configured to selectively receive the reference data $Q_{REF}$ according to the select signal SEL.

As those skilled in the art should understand each operation of the error correcting method 900 after reading the above paragraphs directed to FIG. 1 to FIG. 8, further description is omitted for the sake of brevity.

With the use of reference data having a bit width which is determined according to selection of a memory device, the proposed error correcting scheme can utilize a same ECC circuit to support multiple memory devices having different data path widths and/or different data bit widths, thus saving standby power and reducing circuit areas. The error correcting scheme can serve as a centralized ECC system for multiple memory devices having different data path widths.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An error correcting system shared by a plurality of memory devices, a data path width of each memory device having a data bit width and a parity bit width, the error correcting system comprising:

an error correcting code (ECC) circuit, having M input terminals, the ECC circuit configured to encode input data received from the M input terminals to generate encoded data in response to a write operation, and output the encoded data toward the memory devices, wherein M is a positive integer greater than one, the input data comprises write data associated with the write operation, and the encoded data comprises the input data and associated parity data; and a control circuit, coupled to at least one of the M input terminals, wherein when the write operation is directed to a first memory device of the memory devices having a data bit width less than M bits, the write data is inputted to a first portion of the M input terminals, the control circuit is configured to provide reference data to a second portion of the M input terminals, and the write data and the reference data serve as the input data.

2. The error correcting system of claim 1, wherein the data bit width of the first memory device is P bits, and P is a positive integer less than M; a number of input terminals in the first portion of the M input terminals is equal to P, and a number of input terminals in the second portion of the M input terminals is equal to (M–P).

3. The error correcting system of claim 1, wherein the control circuit has a signal output terminal coupled to the second portion of the M input terminals; the control circuit is configured to couple a reference voltage to the signal output terminal to provide the reference data.

4. The error correcting system of claim 1, wherein the ECC circuit has N output terminals, and N is a positive integer greater than M; the first memory device has a data path width of Q bits, and Q is a positive integer less than N; when the write operation is directed to the first memory device, Q output terminals of the N output terminals are coupled to the first memory device, and the remaining (N–Q) output terminals are uncoupled from the first memory device.

5. The error correcting system of claim 4, further comprising:
a switch circuit, configured to selectively couple the Q output terminals to the first memory device, wherein when the write operation is directed to the first memory device, the switch circuit is configured to couple the Q output terminals to the first memory device; when the write operation is directed to a second memory device of the memory devices different from the first memory device, the switch circuit is configured to uncouple the Q output terminals from the first memory device.

6. The error correcting system of claim 1, wherein when the write operation is directed to a second memory device of the memory devices having a data bit width equal to M bits, the write data is inputted to the M input terminals to serve as the input data.

7. The error correcting system of claim 6, wherein the second memory device has a data path width of N bits; when the write operation is directed to the second memory device, N output terminals of the ECC circuit are coupled to the second memory device.

8. The error correcting system of claim 7, further comprising:
a switch circuit, configured to selectively couple the N output terminals to the second memory device, wherein when the write operation is directed to the first memory device, the switch circuit is configured to uncouple the N output terminals from the second memory device; when the write operation is directed to the second memory device, the switch circuit is configured to couple the N output terminals to the second memory device.

9. The error correcting system of claim 1, wherein the write data is inputted to the ECC circuit through a data interface, and the error correcting system further comprises:
a switch circuit, configured to selectively couple the second portion of the input terminals to the data interface, wherein when the write operation is directed to the first memory device, the switch circuit is configured to uncouple the second portion of the input terminals from the data interface; when the write operation is directed to a second memory device of the memory devices having a data bit width equal to M bits, the switch circuit is configured to couple the second portion of the input terminals to the data interface.

10. The error correcting system of claim 1, wherein each bit of the reference data has a logic low value.

11. An error correcting system shared by a plurality of memory devices, a data path width of each memory device having a data bit width and a parity bit width, the error correcting system comprising:
an error correcting code (ECC) circuit, having N input terminals, the ECC circuit configured to decode input data received from the N input terminals to generate decoded data in response to a read operation, wherein N is a positive integer greater than one, and the input data comprises original data stored in a memory cell associated with the read operation and associated parity data; and
a control circuit, coupled to at least one of the N input terminals, wherein when the read operation is directed to a first memory device of the memory devices having a data path width less than N bits, the read data and the parity data is inputted to a first portion of the N input terminals, the control circuit is configured to provide reference data to a second portion of the N input terminals; the original data, the parity data and the reference data serve as the input data.

12. The error correcting system of claim 11, wherein the data path width of the first memory device is Q bits, and Q is a positive integer less than N; a number of input terminals in the first portion of the N input terminals is equal to Q, and a number of input terminals in the second portion of the N input terminals is equal to (N–Q).

13. The error correcting system of claim 11, further comprising:
a switch circuit, configured to selectively couple the first portion of the N input terminals to the first memory device, wherein when the read operation is directed to the first memory device, the switch circuit is configured to couple the first portion of the N input terminals to the first memory device; when the read operation is directed to a second memory device of the memory devices different from the first memory device, the switch circuit is configured to uncouple the first portion of the N input terminals from the first memory device.

14. The error correcting system of claim 11, wherein the control circuit has a signal output terminal coupled to the second portion of the N input terminals; the control circuit is configured to couple a reference voltage to the signal output terminal to provide the reference data.

15. The error correcting system of claim 11, wherein the decoded data comprises read data corresponding to the original data, and the read data is outputted from the ECC circuit to a data interface; the ECC circuit has M output terminals, and M is a positive integer less than N; the first memory device has a data bit width of P bits, and P is a positive integer less than M; when the read operation is directed to the first memory device, P output terminals of the M output terminals are coupled to the data interface to output the read data, and the remaining (M–P) output terminals are uncoupled from the data interface.

16. The error correcting system of claim 11, wherein when the read operation is directed to a second memory device of the memory devices having a data path width equal to N bits, the original data and the associated parity data is inputted to the N input terminals to serve as the input data.

17. The error correcting system of claim 16, further comprising:
a switch circuit, configured to selectively couple the N input terminals to the second memory device, wherein when the read operation is directed to the first memory device, the switch circuit is configured to uncouple the N input terminals from the second memory device; when the read operation is directed to the second memory device, the switch circuit is configured to couple the N input terminals to the second memory device.

18. The error correcting system of claim 16, wherein the decoded data comprises read data corresponding to the original data, and the read data is outputted from the ECC circuit to a data interface; the second memory device has a data bit width of M bits; when the read operation is directed to the second memory device, M output terminals of the ECC circuit are coupled to the data interface to output the read data.

19. The error correcting system of claim 11, wherein the decoded data comprises read data corresponding to the original data, and the read data is outputted from the ECC circuit to a data interface; the ECC circuit has M output terminals, and M is a positive integer less than N; the first memory device has a data bit width of P bits, and P is a positive integer less than M; the error correcting system further comprises:

a switch circuit, configured to selectively couple (M−P) output terminals of the M output terminals to the data interface, wherein when the read operation is directed to the first memory device, the switch circuit is configured to uncouple the (M−P) output terminals from the data interface; when the read operation is directed to a second memory device 2 of the memory devices having a data bit width equal to M bits, the switch circuit is configured to couple the (M−P) output terminals to the data interface.

20. The error correcting system of claim 11, wherein each bit of the reference data has a logic low value.

* * * * *